United States Patent [19]

Horninger

[11] 4,225,876
[45] Sep. 30, 1980

[54] MONOLITHICALLY INTEGRATED SEMICONDUCTOR ARRANGEMENT

[75] Inventor: Karlheinrich Horninger, Eglharting, Fed. Rep. of Germany

[73] Assignee: Siemens Aktiengesellschaft, Berlin & Munich, Fed. Rep. of Germany

[21] Appl. No.: 939,485

[22] Filed: Sep. 5, 1978

[30] Foreign Application Priority Data

Sep. 6, 1977 [DE] Fed. Rep. of Germany ....... 2740154

[51] Int. Cl.² ............................................ H01L 27/14
[52] U.S. Cl. ...................................... 357/23; 357/41; 307/238; 357/45
[58] Field of Search .......................... 357/23, 41, 45; 365/103; 307/238

[56] References Cited

U.S. PATENT DOCUMENTS

| | | | |
|---|---|---|---|
| 4,075,045 | 2/1978 | Rideout | 148/187 |
| 4,125,854 | 11/1978 | McKenny | 357/41 |
| 4,131,906 | 12/1978 | Kinoshita | 357/41 |
| 4,150,389 | 4/1979 | Roessler | 357/23 |

*Primary Examiner*—Martin H. Edlow
*Attorney, Agent, or Firm*—Hill, Van Santen, Steadman, Chiara & Simpson

[57] ABSTRACT

A monolithically integrated semiconductor arrangement is disclosed wherein a plurality of first lines are provided which run parallel to one another and which are provided with first terminals at one end. A plurality of second lines which run parallel to one another are also provided which cross beneath the first lines and are connected via load elements at one end to a supply voltage terminal. Reference potential lines are also provided adjacent each of the second lines. At a series of selected crossing points of the first and second lines coupling elements are formed which can be operated by the first line and by which the second line is connected to an adjacent reference potential line. The semiconductor arrangement is formed on a semiconductor layer having a thin insulating layer thereon with the second lines and reference potential lines arranged on the thin insulating layer. The first lines are then arranged over the second line and reference potential lines and are separated therefrom by an additional insulating layer. At crossing points selected for coupling, a portion of the first line approaches the semiconductor layer surface more closely and is separated therefrom by the thin insulating line. Diffusion zones are provided at one end of each of the reference potential lines and second lines. With the system disclosed, diffusions are not required for the formation of the first and second lines and coupling elements.

9 Claims, 4 Drawing Figures

MONOLITHICALLY INTEGRATED SEMICONDUCTOR ARRANGEMENT

BACKGROUND OF THE INVENTION

The invention relates to a monolithically integrated semiconductor circuit wherein a fixed word store is formed of first and second lines having selected crossover points provided with a coupling element.

A semiconductor arrangement of this type is disclosed, for example, in the book "Semiconductor Memory Design and Application" by Luecke, Mize and Carr, published in 1973 by the McGraw Hill Book Company, New York, pages 154 and 155, in particular FIG. 6.15. The arrangement described therein is used as a fixed word store (ROM), a binary signal being supplied to a line of a first type via a decoder output and a corresponding multi-digit binary output signal being tapped from a plurality of lines of a second type. Here the lines of the second type and the reference potential lines consist of surface-side zones which possess opposite doping and are diffused into the semiconductor layer, whereas the lines of the first type consist of metallic conductor paths. The production of such a structure in a technique in which the diffusion zones are not produced until following the application of the one-layer or multi-layer, electrically conductive coatings which are insulated from the semiconductor layer, and simultaneously using the latter as a doping mask, is only possible at a considerable surface cost.

SUMMARY OF THE INVENTION

An object of the invention is to provide a semiconductor arrangement of the type referred to above, wherein it is possible to largely dispense with diffusion zones in the semiconductor layer.

This is achieved in accordance with the invention by providing a plurality of first lines formed of a first conductive coating and a plurality of second lines and reference potential lines formed of a second conductive coating. The second lines and reference potential lines are separated by the semiconductor layer by a thin insulating layer and the first lines are separated by an additional insulating layer from the second lines and reference potential lines. At crossing points for which coupling is desired, a portion of the first line approaches more closely to the semiconductor layer and is separated therefrom by the thin insulating layer. Diffusion zones are provided at one end of each of the reference potential lines and first lines. The advantage which can be achieved by the invention consists in particular in that the region of the intersecting line systems contains no zones diffused into the semiconductor layer, and that the oppositely doped semiconductor zones to be provided outside of this region are located at the end of the lines of the second type and the reference potential lines so that these can serve as doping masks.

DESCRIPTION OF THE PREFERRED EMBODIMENTS

Figure 1:
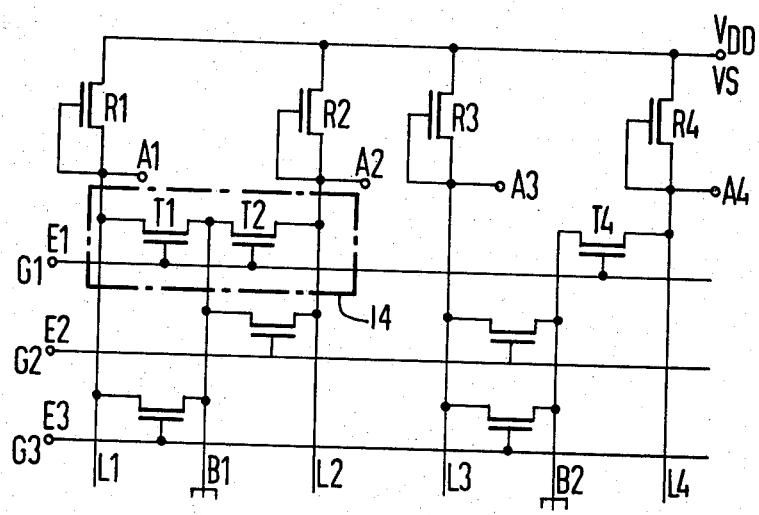
FIG. 1 is the equivalent circuit diagram of a semiconductor arrangement known per se upon which the invention is based.

FIG. 1 shows the circuit diagram of a fixed word storage matrix which, for example, has three electric lines of a first type which are parallel to one another and are referenced G1, G2 and G3 and at their left-hand ends are each connected to first terminals E1, E2 and E3. A plurality of electric lines of a second type, which intersect the lines of the first type, are referenced L1 to L4 and provided with end terminals A1 to A4. These terminals are each followed by load elements R1 to R4 via which the lines L1 to L4 are connected to a supply voltage terminal VS. The lines L1 to L4 are each assigned reference potential lines B1 and B2 in such manner that B1 lies between the lines L1 and L2 and B2 lies between the lines L3 and L4. As indicated in FIG. 1, at their lower ends the lines B1 and B2 are each connected to the reference potential.

Selected intersection points of the individual lines of the first and second types, which on account of their arrangement in FIG. 1 can also be referred to as row lines and column lines, are provided with coupling elements which, at these points, conductively connect the relevant line of the second type to the adjacent reference potential line. Thus, for example, the intersection point of the lines G1 and L1 is provided with a field effect transistor T1 whose gate can be operated via the line G1. If the terminal E1 is supplied with a signal which switches T1 into the conductive state, L1 and B1 are connected to one another via T1. This results in the terminal A1 from which, for example, the supply voltage VDD connected at VS could previously be tapped, being connected to the reference potential of the line B1. The terminals A2 and A4 also experience equal potential shifts under the influence of the signal connected to E1 on account of the transistors T2 and T4, whereas A3 experiences no change in potential as no coupling element is provided at the intersection point of G1 and L3. In this way a signal connected to E1 is assigned a binary output signal, in this case comprising four digits, at A1 to A4, the individual digit signals of which can be determined by the provision or omission of coupling elements. Similarly, a signal connected to E3 would only result in potential shifts at the terminals A1 and A3. In FIG. 1 the load elements R1 to R4 have been represented as field effect transistors whose gate terminals are connected to the relevant source terminals.

Figure 2:
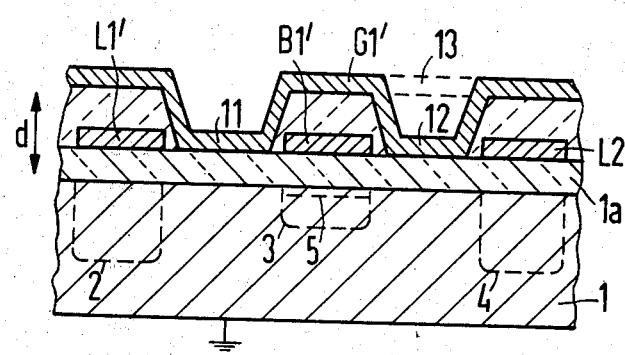
FIG. 2 illustrates an exemplary embodiment of the invention and which generally corresponds to the equivalent circuit diagram illustrated in dotted lines in FIG. 1.
Figure 3:
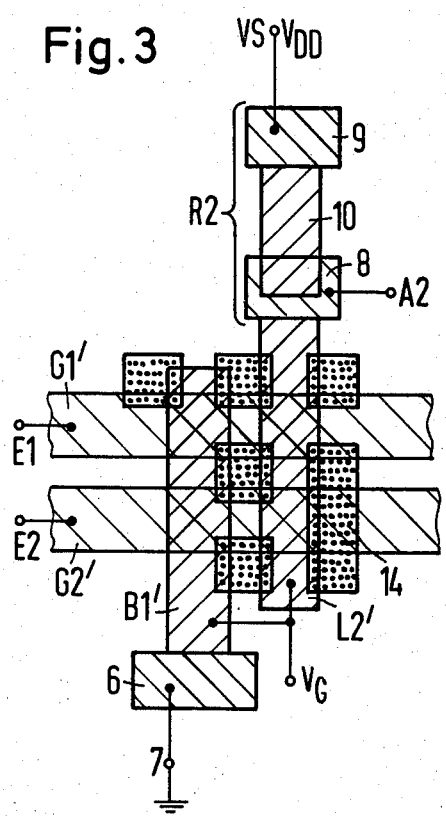
FIG. 3 shows a top view of a portion of the circuit shown in FIG. 2.

FIG. 2 is a cross-section through a part of a semiconductor arrangement corresponding to the invention which corresponds to the schematic illustration of the matrix region shown in dash-dotted fashion at 14 in FIG. 1 whereas FIG. 3 is a top view which shows a structural layout for a portion of the circuit diagram of FIG. 1 and particularly incorporating the structure of FIG. 2. As shown in FIG. 2, a doped semiconductor layer 1, consisting for example of silicon, is covered within this matrix region with a surface-side, thin insulating layer 1a which consists for example of $SiO_2$ and upon which strip-like components L1', B1' and L2' of a first, electrically conductive coating are applied. The components L1', B1' and L2' are connected to a constant voltage $V_G$ as shown in FIG. 3, which produces surface-side space charge zones 2 to 4 shown in FIG. 2 in the underlying zones of the semiconductor layer 1. Under the influence of $V_G$, in the region of the space charge zones 2 to 4 there are also formed inversion edge layers of which that located beneath G1' is referenced 5, in FIG. 2. This layer is set at the reference potential by an oppositely doped, surface-side zone 6, shown in FIG. 3 which is arranged at the end of B1' and is provided with a reference potential terminal 7. In this way the inversion edge layer 5 is retained whereas the inversion edge layers which have formed beneath L1' and L2';0 are withdrawn via end-side, oppositely doped semiconductor zones 8 which are connected to the supply voltage $V_{DD}$ as shown in FIG. 3. Therefore the space charge zones 2 and 4 possess a higher surface potential than the space charge zone 3.

FIG. 3 clearly shows that the semiconductor zone 8 is provided with a terminal A2 and forms the source zone of a field effect transistor R2 whose drain zone 9 possesses a supply voltage terminal VS which is connected to the supply voltage $V_{DD}$. Above the channel zone of the transistor which connects the zones 8 and 9, and separated from the semiconductor layer 2 by a thin insulating layer, is arranged the gate 10 which contacts the semiconductor zone 8 at its lower end. In this way the transistor having elements 8 to 10 represents a load element via which the supply voltage $V_{DD}$ is fed to the zone 8.

The inversion edge layers shown in FIG. 2 which form beneath the strip-like components L1', B1' and L2' can be considered as the lines L1, B1 and L2 of FIG. 1, although only the inversion edge layer which represents the line B1 is stationary in the previously considered state of the arrangement.

The line G1' in FIGS. 2 and 3 generally corresponding to line G1 in FIG. 1 is formed by a strip-like part of a second, electrically conductive coating which part approaches the surface of the semiconductor layer 1 only in the region of the intersections selected for the purposes of coupling, to such an extent that it is separated from said layer only by the thin insulating layer 1a shown in FIG. 2. This is the case in FIG. 2 at the portions 11 and 12 of G1'. If the line G1' is fed via the terminal E1 with an input-end signal, beneath the portions 11 and 12 there likewise forms an inversion edge layer by which the inversion edge layers of the space charge zones 2 and 4 are connected to the inversion edge layer 5. On account of the load elements R1 and R2, the inversion edge layers beneath L1' and L2' also remain, so that now the potential of the oppositely doped zones, for example 8 shown in FIG. 3, assigned to the lines L1' and L2' corresponds to the reference potential which can also be tapped across the terminals A1 and A2. If, for example, no coupling of the lines L2' and B1' is to be carried out at the intersection point of the lines G1' and L2', the line G1' does not approach the semiconductor layer 1 at this point as indicated by the broken line 13 in FIG. 2.

Within the dotted zones of FIG. 3 the thickness of the insulating layer which covers the semiconductor layer 1 corresponds approximately to the dimension d in FIG. 2 so that no disturbing influence can occur between the individual coupling points.

Figure 4:
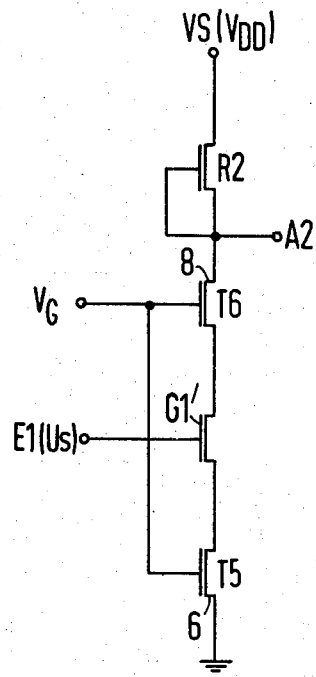
FIG. 4 is an equivalent circuit diagram of the sub-region illustrated in FIG. 3.

FIG. 4 is an equivalent circuit diagram of the exemplary embodiment of the invention illustrated in FIGS. 2 and 3, although only those parts which can be seen in the sectional illustration in FIG. 3 have been characterized by electrical symbols. Here the zone 6 is to be considered as the source zone of a field effect transistor T5, whereas the zone 8 represents the drain zone of a field effect transistor T6. At their source-drain paths, which are formed by the inversion edge layers beneath L2' and B1', these transistors are connected in series to one another and to the inversion edge layer which forms beneath G1', and the entire series arrangement lies between the circuit point A2 and reference potential. Thus, in dependence upon the signal $U_S$ supplied to the terminal E1, an output signal corresponding to the output voltage of an inverter stage connected to the supply voltage $V_{DD}$ can be tapped from the terminal E1.

In accordance with a further development of the invention, the zones which have been shown dotted in FIG. 3 and in which the insulating layer which covers the semiconductor layer 1 has a relatively large thickness, are omitted apart from the sub-zone 14. This sub-zone, which continues to possess a thick insulating layer, is arranged beneath a portion of the line G2' via which no coupling is to be effected between two lines and which therefore corresponds to the portion 13 in FIG. 2. In order to avoid disturbing influences between the individual coupling points, it is necessary, however, that those regions of the semiconductor layer 1 which are not covered by the lines of the first and second type and by the reference potential lines should be more strongly doped than the other regions which can be effected, for example, by ion implantation. An arrangement of this type allows a storage capacity of e.g. 26000 bits to be accommodated on a semiconductor area of approximately 1 mm².

The load elements R1 to R4 can be designed as field effect transistors of the enhancement type, possibly having a gate connected to a pulsed voltage, or can also consist of field effect transistors of the depletion type. The electric, conductive coatings from which the components L1', L2', B1', G1' and G2' are formed can advantageously consist of a highly doped semiconductor material, for example polycrystalline silicon, or can also consist of metallic coatings.

If one of the terminals E1 to E3 is supplied during operation with a binary input signal which produces an inversion edge layer under the provided coupling points of the relevant line of the first type, a binary output signal determined by a given logic link occurs at the terminals A1 to A4, which corresponds to operating the semiconductor arrangement as a fixed word store (ROM—read only memory). On the other hand, the terminals E1 to E3 can also be supplied with a binary input signal in which case a binary output signal occurs at one of the terminals A1 to A4 whose assigned line of the second type currently possesses coupling points corresponding to the supplied binary signal. This mode of operation then corresponds to that of a decoder. Furthermore the terminals E1 to E3 can also be supplied with a three-digit, binary signal which is converted to a four-digit, binary output signal which can be tapped at A1 to A4. This corresponds, for example, to the mode of operation of an AND-matrix in a programmable logic arrangement (PLA).

The number of represented lines of the first and second type, and the reference potential lines has been selected to be relatively low simply in order to clarify the mode of operation of the invention. In practical use, the semiconductor arrangement corresponding to the invention contains considerably more lines of the described type.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A monolithically integrated semiconductor arrangement comprising: p1 (a) a plurality of first lines of a first type which run parallel to one another and are provided with end-side, first terminals;
   (b) a plurality of second lines of a second type which run parallel to one another crossing beneath the first lines and are connected via end-side load elements to a supply voltage terminal, second terminals being provided at a connection of the second lines to the load elements;
   (c) a plurality of reference potential lines which are adjacent to the second lines, a series of selected crossing points of the first and second lines forming a coupling element which can be operated via the first line and by which the second line can be connected to an adjacent reference potential line;
   (d) a doped semiconductor layer having a surface;
   (e) said second lines and the reference potential lines being formed of strip-like members of a second conductive coating which are separated by a thin insulating layer from the surface of the doped semiconductor layer;
   (f) said reference potential lines extending to first peripheral oppositely doped surface zones provided with reference potential terminals;
   (g) said second lines extending to second peripheral oppositely doped surface zones having the second terminals;
   (h) the second oppositely doped zones being connected via load elements to the supply voltage terminals; and
   (i) the first lines being arranged above the second lines and reference potential lines and comprising strip-like members of a first electrically conductive coating which approach the semiconductor surface closely only in a region of said crossing points selected for coupling and are there separated from the semiconductor surface only by a thin insulating layer.

2. A semiconductor arrangement as claimed in claim 1 wherein the load elements comprise field effect transistors having a source-drain path and gate terminals connected to a terminal of the source-drain path.

3. A semiconductor arrangement as claimed in claim 1 in which regions of the doped semiconductor layer surface not covered by the first and second lines and by the reference potential lines are more strongly doped than other regions thereof, the thin insulating layer separating the first lines at the intersection points selected for coupling covering a matrix region of the semiconductor layer surface with the exception of sub-zones comprising portions of the first lines located at the crossing points not selected for coupling, said sub-zones being further located between the second lines and the reference potential lines, said sub-zones of the semiconductor surface being covered with a thicker insulating layer.

4. A semiconductor arrangement as claimed in claim 1 wherein the second electrically conductive coating comprises a highly doped semiconductor material of polycrystalline silicon.

5. A semiconductor arrangement as claimed in claim 1 wherein the first electrically conductive coating comprises a highly doped semiconductor material of polycrystalline silicon.

6. A method for operating a semiconductor arrangement as a fixed word store (Read Only Memory), said arrangement having a plurality of first lines which run parallel to one another and are provided with end-side first terminals, a plurality of second lines which run parallel to one another crossing beneath the first lines and are connected at one end by load elements to a supply voltage terminal, second terminals being provided at a connection of the second lines to the load elements, a plurality of reference potential lines adjacent the second lines, a series of selected crossing points of the first and second lines forming a coupling element operable by the first line and by which the second line can be connected to an adjacent reference potential line, said first and second lines comprising conductive strips separated by insulating means from one another and a semiconductor layer surface, comprising the steps of: feeding one of the first terminals with a binary input signal, and tapping a binary output signal from a plurality of said second terminals.

7. A method for operating a semiconductor arrangement as a decoder circuit, said arrangement having a plurality of first lines which run parallel to one another and are provided with end-side first terminals, a plurality of second lines which run parallel to one another crossing beneath the first lines and are connected at one end by load elements to a supply voltage terminal, second terminals being provided at a connection of the second lines to the load elements, a plurality of reference potential lines adjacent the second lines, a series of selected crossing points of the first and second lines forming a coupling element operable by the first line and by which the second line can be connected to an adjacent reference potential line, said first and second lines comprising conductive strips separated by insulating means from one another and a semiconductor layer surface, comprising the steps of: supplying a plurality of the first terminals with a corresponding multi-digit binary signal, and tapping an output signal from one of the second terminals.

8. A method for operating a semiconductor arrangement as a matrix within a programmable logic arrangement, said semiconductor arrangement having a plurality of first lines which run parallel to one another and are provided with end-side first terminals, a plurality of second lines which run parallel to one another crossing beneath the first lines and are connected at one end by load elements to a supply voltage terminal, second terminals being provided at a connection of the second lines to the load elements, a plurality of reference potential lines adjacent the second lines, a series of selected crossing points of the first and second lines forming a coupling element operable by the first line and by which the second line can be connected to an adjacent reference potential line, said first and second lines comprising conductive strips separated by insulating means for one another and a semiconductor layer surface, comprising the steps of: supplying a plurality of first terminals with a corresponding multi-digit binary signal and tapping from a plurality of the second terminals a binary output signal assigned by a fixed logic link formed by the coupling elements.

9. A monolithically integrated semiconductor arrangement, comprising:

(a) a semiconductor layer of first conductivity type and having a major surface;
(b) a plurality of parallel second strip lines and reference potential lines of a second conductive coating over the major surface and separated therefrom by a first insulating layer means;
(c) a plurality of parallel first strip lines of a first conductive coating crossing over the second strip lines and reference potential lines and being separated therefrom by a second insulating layer means;
(d) field effect transistor coupling means being formed at selected crossing points of the first lines over the second lines in accordance with a desired logic format, first portions of the first strip lines at each selected crossing point approaching the surface of the semiconductor layer closer than other portions of the first strip lines and being separated from the semiconductor surface substantially only by the first insulating layer means, a gate of the coupling means being formed by the first strip line first portions, said coupling means coupling a second strip line to an adjacent reference potential line; and
(e) an opposite conductivity type diffused region being provided in the semiconductor layer at one end of each of the reference potential lines and first strip lines.

* * * * *